United States Patent [19]
Schulz

[11] Patent Number: 5,853,491
[45] Date of Patent: Dec. 29, 1998

[54] METHOD FOR REDUCING METAL CONTAMINATION OF SILICON WAFERS DURING SEMICONDUCTOR MANUFACTURING

[75] Inventor: Peter Schulz, Regensburg, Germany

[73] Assignee: Siemens Aktiengesellschaft, Munich, Germany

[21] Appl. No.: 827,150

[22] Filed: Mar. 27, 1997

Related U.S. Application Data

[63] Continuation-in-part of Ser. No. 266,279, Jun. 27, 1994, Pat. No. 5,637,151.

[51] Int. Cl.$^6$ .............................. B08B 3/04; C23F 1/24; C23G 1/02
[52] U.S. Cl. ................... 134/2; 134/1; 134/1.2; 134/1.3; 134/3; 252/102
[58] Field of Search ........................ 134/2, 1, 3; 252/102

[56] References Cited

U.S. PATENT DOCUMENTS

| | | | |
|---|---|---|---|
| 4,116,714 | 9/1978 | Basi | 134/3 |
| 4,264,374 | 4/1981 | Beyer et al. | 134/3 |
| 4,885,106 | 12/1989 | Lapham et al. | 252/100 |
| 4,913,823 | 4/1990 | Lipinski et al. | 210/699 |
| 4,963,283 | 10/1990 | Lapham et al. | 252/79.3 |
| 4,985,228 | 1/1991 | Kirksey | 423/584 |
| 5,051,134 | 9/1991 | Schnegg et al. | 134/3 |
| 5,213,622 | 5/1993 | Bohling et al. | 134/3 |
| 5,290,361 | 3/1994 | Hayashida et al. | 134/2 |
| 5,489,557 | 2/1996 | Jolley | 156/640 |
| 5,509,970 | 4/1996 | Shiramizu | 134/3 |
| 5,656,097 | 8/1997 | Olesen et al. | 134/1 |

OTHER PUBLICATIONS

Meuris, et. al. The Relationship of the Silicon Surface Roughness and Gate Oxide Integrity in $NH_4OH/H_2O_2$ Mixtures. Japanese J. Appl. Physics vol. 31 (1992) pp. L1514–L1517 Part 2. No. IIA, Nov. 1992.

*Primary Examiner*—Jill Warden
*Assistant Examiner*—Yolanda E. Person
*Attorney, Agent, or Firm*—Stanton C. Braden

[57] ABSTRACT

A complex building agent, such as EDTA is added in a predetermined concentration to the "SC 1" step of a "PIRANHA-RCA" cleaning sequence for reducing the metal contamination left on the surface of a silicon wafer after completion of this cleaning step.

8 Claims, 1 Drawing Sheet

A. PIRANHA ($H_2SO_4$ + $H_2O_2$ + $H_2O$)

B. WATER RINSING

C. SC 1 ($NH_4OH$ + $H_2O_2$ + $H_2O$)

D. WATER RINSING

E. SC 2 (HCl + $H_2O_2$ + $H_2O$)

F. WATER RINSING

G. WAFER DRYING

A. PIRANHA ($H_2SO_4$ + $H_2O_2$ + $H_2O$)

B. WATER RINSING

C. SC 1' ($NH_4OH$ + $H_2O_2$ + $H_2O$
 + COMPLEX BUILDING AGENT*)

*e.g. EDTA OR DEQUEST

D. WATER RINSING

E. SC 2 (HCl + $H_2O_2$ + $H_2O$)

F. WATER RINSING

G. WAFER DRYING

METHOD FOR REDUCING METAL CONTAMINATION OF SILICON WAFERS DURING SEMICONDUCTOR MANUFACTURING

This application is a continuation-in-part of application Ser. No. 08/266,279 filed on Jun. 27, 1994, now U.S. Pat. No. 5,637,151.

TECHNICAL FIELD OF THE INVENTION

The present invention relates generally to the fabrication of semiconductors, and more particularly to the cleaning of semiconductor or silicon wafers over the course of producing the ultimate semiconductor product, such as an integrated circuit, whereby the intermediary cleaning steps remove contaminates deposited upon the surface of the associated silicon wafers during prior processing steps.

BACKGROUND OF THE INVENTION

Typically, in producing complex semiconductor products, such as integrated circuit devices, thousands of processing steps are required to obtain the resultant product. In order to enhance profitability, it is important that the yield or numbers of useful integrated circuit devices obtained from a single silicon wafer during processing be maximized. Accordingly, semiconductor manufacturers go to great lengths to provide the greatest yield during the manufacturing of the semiconductor devices. Such devices are typically manufactured under clean room conditions in order to substantially eliminate any airborne contaminates from reaching the surface of the silicon wafers during processing, and reducing the yield. Also, during the actual processing of the silicon wafers, certain other processing steps may themselves cause contaminates to be deposited upon the wafer surface, making it necessary after predetermined processing steps have been completed, to clean the surface of the wafer before proceeding with subsequent processing or manufacturing steps, in order to ensure the highest possible yield on the devices being produced.

A typical cleaning cycle during the manufacture of semiconductor products involves wet wafer cleaning, which usually involves a plurality of cleaning steps. Initial steps typically involve either spraying a mixture of chemicals and water onto the surface of the wafer, or immersing the wafer into such a mixture, followed by water rinse steps and drying steps, before the silicon wafer proceeds to further device processing. A cleaning sequence commonly known in the art as "RCA-clean" is often used in semiconductor manufacturing. One of the steps used in the "RCA-clean" is commonly known as the "SC 1" step, for removing particles from the surface of the silicon wafers being processed. However, the "SC 1" step tends to increase the metal contamination on the surface of the wafer, requiring that a subsequent cleaning step commonly known as "SC 2" be included to reduce the metal contamination from the prior "SC 1" step. Unfortunately, even with this additional "SC 2" step, it has been determined that the remaining metal concentration on the surface of the semiconductor silicon wafer is often not reduced to a low enough level, whereby the remaining metal concentration tends to reduce the yield of devices such as 64M DRAMs and 256M DRAMs, for example. Accordingly, semiconductor manufacturers are conducting ongoing research programs to find ways to further reduce the metal concentration remaining on the silicon wafers after cleaning sequences.

SUMMARY OF THE INVENTION

An object of the invention is to reduce the concentration of metal on the surface of a silicon wafer subsequent to a cleaning sequence during the fabrication of semiconductor devices there-from.

Another object of the invention is to improve the cleaning sequence known as "RCA-clean", for substantially reducing the metal contamination on the surface on the wafer cleaned in such a sequence.

With these and other objects in mind, and to overcome the problems in the prior art, the present inventor has developed an improved "RCA-clean" cleaning sequence for semiconductor manufacturing, wherein in the "SC 1" step of this sequence, a predetermined concentration of a complex building agent selected from the group including EDTA (ethylendiamintetraacetic acid), or DEQUEST (phosphates with organic chains containing amines) is added to the wet clean mixture or formula of the "SC 1", for retaining metal complexes bound in the cleaning solution, thereby reducing the metal contamination on the surface of the silicon wafer being processed during the cleaning sequence.

BRIEF DESCRIPTION OF THE DRAWINGS

Various embodiments of the present invention are described below with reference to the drawings, in which like items are identified by the same reference designation, and in which.

DETAILED DESCRIPTION

Figure 1:
FIG. 1 shows a flowchart for a semiconductor manufacturing cleaning sequence commonly known as "RCA-clean".
Figure 2:
FIG. 2 shows a flowchart for a semiconductor manufacturing cleaning sequence of an embodiment of the invention, that is an improvement of the "RCA-clean" of FIG. 1.

In semiconductor manufacturing, typically a silicon wafer is processed to chemically and physically change the wafer. Such processing may include steps for epitaxially growing layers of semiconductor material on a substrate provided by the base silicon wafer, etching portions of the wafer as it is being processed, doping portions of the wafer to have either n or p conductivity, and so forth. During the typically thousands of steps necessary to produce integrated circuit devices, for example, it is necessary at the end of a series of such steps to introduce a cleaning sequence. FIG. 1 shows a conventional cleaning sequence which is commonly known as the "RCA-clean." The RCA-clean includes a plurality of steps "B" through "G". Typically, an additional step, shown as step "A" or the "PIRANHA" step, is added to the "RCA-clean" steps "B" through "G", for providing a "PIRANHA-RCA" cleaning sequence. The functions of the sequence of steps are as follow. In step "A" or the "PIRANHA" organic contaminants are removed from the silicon wafers being cleaned; in step "C" or "SC 1" particles are removed from the silicon wafer; and in step "E" or "SC 2", metal contaminates such as, for example, $Fe^{3+}$ are removed from the silicon wafers. Steps "B", "D", and "F" are water rinse steps, and step "G" is a wafer drying step.

It has been discovered that substantially the same result can be obtained in cleaning silicon wafers using a "dilute chemistry for the RCA-clean steps" relative to the concentration used in the "original RCA-clean" formula. Table 1, as shown below, shows the chemicals and the concentrations for both the original and the dilute "PIRANHA-RCA" cleaning steps "A", "C" and "E". All concentration percentages in this disclosure are by weight.

TABLE 1

| NAME OF THE PROCESS STEP | CHEMICAL | CONCENTRATION "ORIGINAL FORMULA" | CONCENTRATION "DILUTE FORMULA" |
|---|---|---|---|
| Piranha | $H_2SO_4$ | 70% | 70% |
|  | $H_2O_2$ | 4% | 4% |
| SC 1 | $NH_4OH$ | 4% | 0.004–0.2% |
|  | $H_2O_2$ | 5% | 0.003–0.3% |
| SC 2 | HCl | 6% | 0.005–0.5% |
|  | $H_2O_2$ | 5% | 0.004–0.5% |

The chemical solution shown in table 1 can either be applied to a silicon wafer by use of a spray tool, whereby the solutions or mixtures are sprayed directly on the wafers, or the silicon wafers are submerged in a bath of the chemical mixture or solution contained within a tank tool. A commonly used spray tool is an "FSI MERCURY OC". Also, commonly used tank tools include any one of a "Pokorny Wet Bench", "SMS Wet Bench", a "DNS Auto Cleaner", or a "Sankyo Auto Cleaner".

Typically, the concentration of metal contaminates such as $Fe^{3+}$ left on surfaces of silicon wafers cleaned by the "Piranha-RCA" sequence of FIG. 1 is higher than desired, causing a reduced yield during the manufacture of complex integrated circuit such as 64M DRAMs and 256M DRAMs, for example. However, adding complex building agents selected from the group including EDTA or DEQUEST to either the SC1 step (step C) of the original or dilute formula substantially reduces metal contamination. It is believed that the complex building agents react with the metal contaminates. The reaction causes the metal contaminates to bind to the building agents, forming complexes. As a result, the metal ions remain suspended in the cleaning solution. Thus, the agents prevent the associated metal from contaminating the surface of the silicon wafers being cleaned.

An experiment was conducted to measure the concentration of metal contaminates (iron (Fe), nickel (Ni) and calcium (Ca) remaining after an original Piranha-RCA cleaning sequence and after a diluted Piranha-RCA with complex building agent cleaning sequence. The measurements were made with an atomic absorption spectrometer (AAS) employing vapor phase decomposition (VPD) technique. The AAS, for example, is manufactured by VARIAN. The results of the experiment are listed in Table 2. As shown, the use of complex building agents substantially reduces the concentration of metal contaminates left on a silicon wafer surface to below levels which are detectable by the the AAS.

TABLE 2

| METAL | CONCENTRATION WITHOUT COMPLEX BUILDER IN ORIGINAL SC 1 | CONCENTRATION WITH COMPLEX BUILDER IN DILUTED SC 1 |
|---|---|---|
| Fe | 0.9–5 * $10^{10}$ atoms/cm$^2$ | <0.3 * $10^{10}$ atoms/cm$^2$ |
| Ni | 0.5–1.7 * $10^{10}$ atoms/cm$^2$ | <0.5 * $10^{10}$ atoms/cm$^2$ |
| Ca | 0.7–11 * $10^{10}$ atoms/cm$^2$ | <0.5 * $10^{10}$ atoms/cm$^2$ |

*Values with "<" in front show results below detection limit

In accordance with the invention, EDTA is added the step C or SC 1 step of the original or dilute formula clean sequence. The concentration of EDTA added is sufficient to effectively reduce metal contamination to below detectable levels. In one embodiment, the concentration of EDTA added is between about 0.05 mg/l and 0.10 mg/l.

It has been found that, in order to achieve optimum results, the concentration of EDTA depends on the concentration of other chemicals used in the solution including whether the original or dilute chemistry "Piranha-RCA" is used. For example, it was discovered that optimum results are obtained in adding 0.10 mg/l EDTA to the "SC 1" step of the original "Piranha-RCA" clean formula. For a dilute "Piranha-RCA" formula containing about 0.004% by weight of $NH_4OH$, and about 0.003% by weight of $H_2O_2$, adding a concentration of EDTA of about 0.05 mg/l produces optimum results. Such concentration of EDTA is effective in keeping metal contaminates bound in solution to substantially prevent them from being retained on the surface of the silicon wafer.

Alternatively, DEQUEST is added to step C or SC 1 step of the original or dilute formula in a concentration sufficient to effectively reduce metal contamination. The metal contamination is reduced below detectable levels. In one embodiment, DEQUEST in a concentration ranging from about 0.10 mg/l to 0.30 mg/l is added to the SC 1 step of the original or dilute cleaning sequence. Such concentration of DEQUEST is effective in keeping metal contaminates bound in solution to substantially prevent them from being retained on the surface of the silicon wafer.

The DEQUEST concentration is dependent upon the concentration of other chemicals used in the solution including whether the original or dilute chemistry "Piranha-RCA" is used. For example, adding a concentration of about 0.30 mg/l of DEQUEST to the original "Piranha-RCA" clean formula containing about 4% by weight of $NH_4OH$, and about 5% by weight of $H_2O_2$ has been found to produce optimum results. For the dilute clean formula containing about 0.004% by weight of $NH_4OH$, and about 0.003% by weight of $H_2O_2$, adding a concentration of about 0.10 mg/l produces optimum results in reducing metal contamination.

When a spray tool is employed, the time between the mixing of the chemicals and the processing of the silicon wafers may be too short to permit the chemical complex to form (i.e., metal contaminates binding to the complex agents). To allow enough time for the chemical complex to form, a tank tool is employed in the cleaning of the silicon wafers in step "C".

Also, an automatic injector can be included in the cleaning system hardware for adding a predetermined quantity of the complex builder to the cleaning solution for the "SC 1'" step. Such automatic injectors are produced by, for example, the METROHM Company.

In an alternative embodiment, ozone ($O_3$) is employed instead of $H_2O_2$ in the Piranha, SC1 and SC2 steps of the clean sequence. The use of $O_3$ in either the original or dilute chemistry for the Piranha RCA clean steps effectively achieves substantially the same results as the original RCA-clean formulas. The chemicals and concentrations for both the original and dilute "Piranha-RCA" cleaning steps "A", "C" and "E" employing $O_3$ are shown in Table 3.

TABLE 3

| NAME OF THE PROCESS STEP | CHEMICAL | CONCENTRATION "ORIGINAL FORMULA WITH $O_3$" | CONCENTRATION "DILUTE FORMULA WITH $O_3$" |
|---|---|---|---|
| Prianha | $H_2SO_4$ | 70% | 70% |
|  | $O_3$ | 4% | 4% |
| SC 1 | $NH_4OH$ | 4% | 0.004–0.2% |
|  | $O_3$ | 5% | 0.003–0.3% |

TABLE 3-continued

| NAME OF THE PROCESS STEP | CHEMICAL | CONCENTRATION "ORIGINAL FORMULA WITH $O_3$" | CONCENTRATION "DILUTE FORMULA WITH $O_3$" |
|---|---|---|---|
| SC 2 | HCl | 6% | 0.005–0.5% |
|  | $O_3$ | 5% | 0.004–0.5% |

Incorporation or introduction of $O_3$ into the cleaning solution is achieved by employing an $O_3$ generator, such as those manufactured by, for example, BBC Brown Bowery or Wedeco in Germany. In one embodiment, the $O_3$ generator is a SWO 100 from Wedeco. Typically, the $O_3$ generator comprises a gas cylinder that generates $O_3$ from $O_2$. For example, to produce a SC 1 solution with $O_3$, the desired concentration of $O_3$ is introduced into a solution having the desired concentration of $NH_4OH$. In one embodiment, the $O_3$ generator is connected to the bottom of a tank containing $NH_4OH$ solution of the desired concentration. The desired concentration of $O_3$ is introduced into the tank using, for example, a diaphragm.

Optionally, complex building agents selected from the group including EDTA or DEQUEST are added to step C or the SC 1 step of the original or dilute formula with $O_3$ to reduce metal contamination. The concentration of EDTA is sufficient to effectively reduce metal contamination below detectable levels. In one embodiment of the invention, the concentration of EDTA is between about 0.05 mg/l and 0.10 mg/l. Such concentration of EDTA is effective in keeping metal contaminates bound in solution to substantially prevent them from being retained on the surface of the silicon wafer.

It has been found that, in order to achieve optimum results, the concentration of EDTA depends on the concentration of other chemicals used in the solution including whether the original or dilute chemistry "Piranha-RCA" is used. For example, it was discovered that optimum results are obtained in adding 0.10 mg/l EDTA to the "SC 1" step of the original "Piranha-RCA" clean formula. For a dilute "Piranha-RCA" formula containing about 0.004% by weight of $NH_4OH$, and about 0.003% by weight of $O_3$, adding a concentration of EDTA of about 0.05 mg/l produces optimum results.

Alternatively, DEQUEST is added to the modified "SC 1" step of the modified cleaning sequence in a concentration sufficient to effectively reduce metal contamination to below detectable levels. In one embodiment of the invention, the concentration of DEQUEST added to the modified "SC 1" step of the modified cleaning sequence ranges from about 0.10 mg/l to 0.30 mg/l. Such concentration of DEQUEST is effective in keeping metal contaminates bound in solution to substantially prevent them from being retained on the surface of the silicon wafer.

The DEQUEST concentration is dependent upon the concentration of other chemicals used in the solution including whether the original or dilute chemistry "Piranha-RCA" is used. For example, adding a concentration of about 0.30 mg/l of DEQUEST to the original "Piranha-RCA" clean formula containing about 4% by weight of $NH_4OH$, and about 5% by weight of $O_3$ has been found to produce optimum results. For the dilute clean formula containing about 0.004% by weight of $NH_4OH$, and about 0.003% by weight of $O_3$, adding a concentration of about 0.10 mg/l produces optimum results in reducing metal contamination.

Although various embodiments of the present invention have been shown and described above, they are not meant to be limiting. Certain modifications of these embodiments may occur to those of skill in the art, which modifications are meant to be covered by the spirit and scope of the appended claims.

What is claimed is:

1. A method for reducing the metal contamination on the surface of a silicon wafer during an "RCA-clean" cleaning sequence performed on said silicon wafer in fabricating semiconductor devices therefrom, said method comprising the improvement steps of:

adding a said concentration ranging from 0.05 mg/l to 0.10 mg/l of a complex building agent EDTA to a chemical solution selected from the group consisting of ($NH_4OH+H_2O_2+O_3$) or ($NH_4OH+H_2O_2+H_2O$) provided for use in an "SC 1" cleaning step of said "RCA-clean", to provide a modified "SC 1" cleaning solution for keeping metal complexes bound in solution to substantially prevent the metals from being retained on the surface of said silicon wafer said concentration of EDTA being dependent upon the concentrations of ammonium hydroxide and ozone;

retaining said modified "SC 1" cleaning solution in a tank tool; and submerging said silicon wafer in said modified "SC 1" cleaning solution in said tank tool, for a predetermined period of time to form a chemical complex with metal contaminates on the surface of silicon wafers during an "SC 1" step of said improved "RCA-clean".

2. The method of claim 1, wherein in said selecting step the concentration of EDTA is 0.10 mg/l, for addition to an "SC 1" original formula of 4% by weight of $NH_4OH$, and 5% by weight of $O_3$.

3. The method of claim 1, wherein in said selecting step the concentration of EDTA is 0.05 mg/l, for addition to an "SC 1" dilute formula of 0.004% by weight of $NH_4OH$, and 0.003% by weight of $O_3$.

4. A modified cleaning solution for improving the "SC 1" cleaning step of an "RCA-clean" sequence for silicon wafers by keeping metal complexes bound in solution during "SCI" cleaning of silicon wafers to substantially reduce metal contamination of surfaces of silicon wafers, comprising: a predetermined concentration of a complex building agent selected from the group consisting of EDTA and a chemical solution ($NH_4OH+H_2O_2+O_3$) or ($NH_4OH+H_2O_2+H_2O$) (formula for the "SC 1" step.

5. The modified "SC 1" cleaning solution of claim 4, wherein said complex building agent consists of a concentration of EDTA ranging from 0.05 mg/l to 0.10 mg/l, dependent upon the concentration of $NH_4OH$ and $O_3$.

6. The modified "SC 1" cleaning solution of claim 4, wherein the concentration of EDTA is 0.10 mg/l, for an "SC 1" original formula of 4% by weight of $NH_4OH$, and 5% by weight of $O_3$.

7. The modified "SC 1" cleaning solution of claim 2, wherein the concentration of EDTA is 0.05 mg/l, for an "SC 1" dilute formula of 0.004% by weight of $NH_4$ OH, and 0.003% by weight of $O_3$.

8. The modified "SC 1" cleaning solution of claim wherein said complex building agent consists of EDTA having a concentration ranging from 0.05 mg/l to 0.10 mg/l, for concentrations of $NH_4OH$ ranging for 0.004% by weight to 4% by weight, respectively, and of $O_3$ ranging from 0.003% by weight to 5% by weight, respectively.

* * * * *